United States Patent
Katsumura et al.

(10) Patent No.: US 7,052,995 B2
(45) Date of Patent: May 30, 2006

(54) PROCESS OF MANUFACTURING SEMICONDUCTOR DEVICE INCLUDING CHEMICAL-MECHANICAL POLISHING

(75) Inventors: Nobuhito Katsumura, Yokohama (JP); Yoshiteru Katsumura, Yokohama (JP); Hidemi Sato, Yokohama (JP); Norihiro Uchida, Hitachinaka (JP); Fumiyuki Kanai, Nishitokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/176,666

(22) Filed: Jun. 24, 2002

(65) Prior Publication Data

US 2003/0025200 A1     Feb. 6, 2003

(30) Foreign Application Priority Data

Jun. 29, 2001    (JP)    ............................. 2001-198436
Mar. 7, 2002    (JP)    ............................. 2001-061300

(51) Int. Cl.
*H01L 21/302*    (2006.01)

(52) U.S. Cl. ...................... 438/692; 438/633; 438/693; 438/690; 438/691

(58) Field of Classification Search ........ 438/690–693, 438/745, 631–633, 643, 648, 653, 656, 672, 438/675, 685–688

See application file for complete search history.

(56) References Cited

U.S. PATENT DOCUMENTS

| | | | | |
|---|---|---|---|---|
| 6,294,027 | B1* | 9/2001 | Li et al. | ............ 134/3 |
| 6,506,682 | B1* | 1/2003 | Lee et al. | ............ 438/693 |
| 2002/0019128 | A1* | 2/2002 | Lee et al. | ............ 438/645 |
| 2003/0079416 | A1* | 5/2003 | Ma et al. | ............ 51/307 |

FOREIGN PATENT DOCUMENTS

| | | |
|---|---|---|
| CN | 1437643 | 4/2001 |
| JP | 10-163142 | 6/1998 |
| JP | 10-214834 | 8/1998 |
| JP | 11-186200 | 7/1999 |
| JP | 2001-044156 | 2/2001 |
| JP | 2001-210612 | 8/2001 |
| WO | WO 01/81490 | 11/2001 |

OTHER PUBLICATIONS

Chinese Office Action for corresponding Chinese Application No. 02140212.4, dated Apr. 30, 2004, with English-language equivalent.

* cited by examiner

*Primary Examiner*—Thanh Nguyen
(74) *Attorney, Agent, or Firm*—Antonelli, Terry, Stout and Kraus, LLP.

(57) ABSTRACT

A buried film and a barrier film are polished together using a slurry in which the polishing rate on a substrate material (in particular, silicon oxide), that on a buried-film material (in particular, tungsten) and that on a barrier-film material (in particular, titanium oxide) are substantially equal to one another. This can materialize a buried structure free from any step or steps, at a high polishing rate.

23 Claims, 7 Drawing Sheets

FIG.1 Background
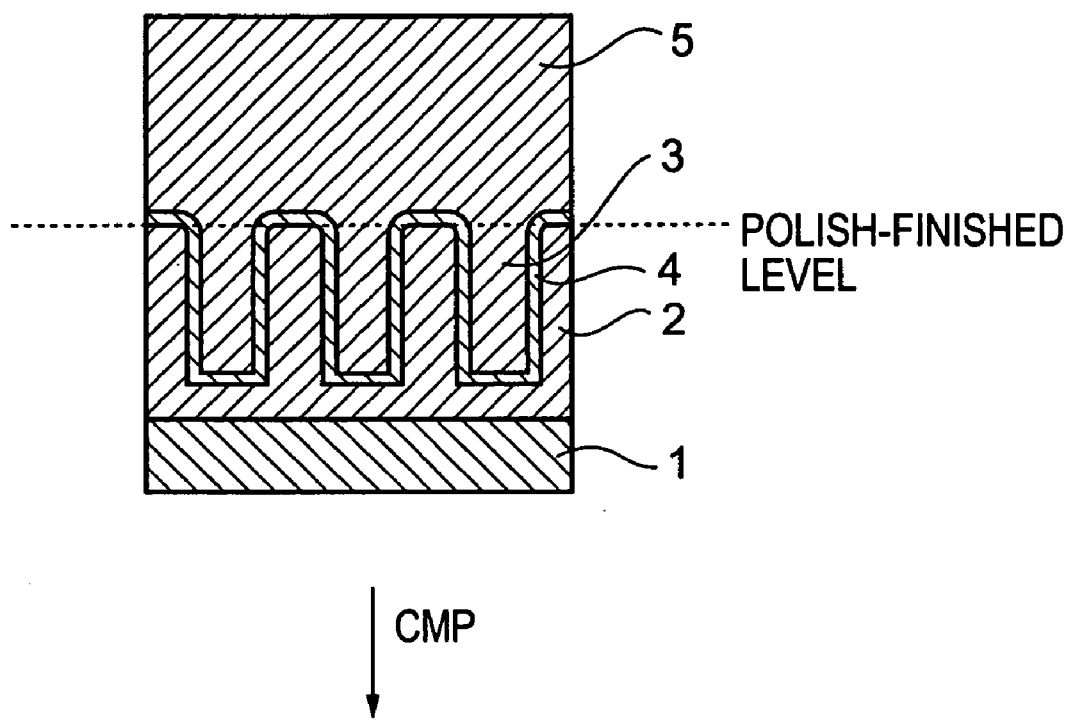
CMP
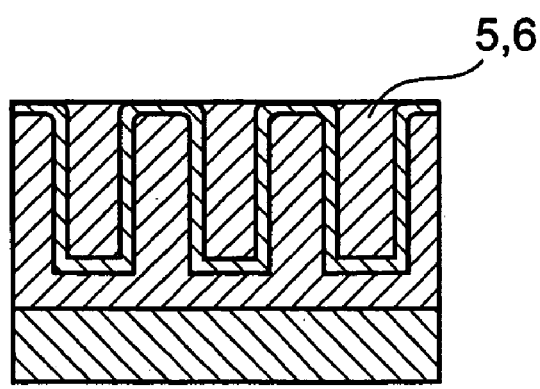

FIG.2
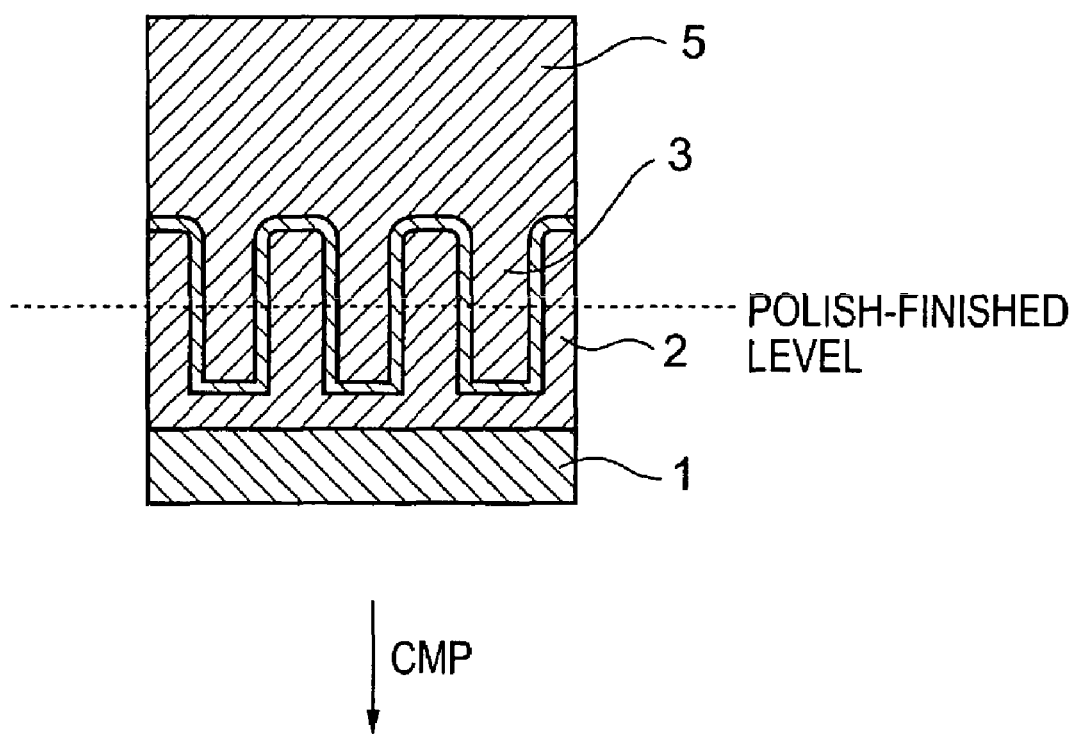
POLISH-FINISHED LEVEL
↓ CMP
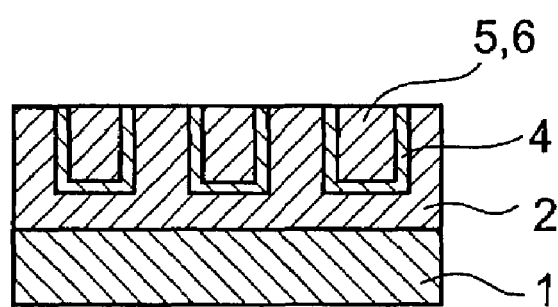

POLISH-FINISHED LEVEL

PROCESS OF MANUFACTURING SEMICONDUCTOR DEVICE INCLUDING CHEMICAL-MECHANICAL POLISHING

BACKGROUND OF THE INVENTION

1. Field of the Invention

This invention relates to a slurry (polishing medium) especially suited for the polishing of silicon substrates having thin films, and to a semiconductor manufacturing process making use of the same.

2. Description of the Related Art

As the integration of semiconductor devices is being made higher, device structure is being made three-dimensional by forming their wiring in multilayer or making capacitor cells three-dimensional in memory LSIs. However, making it three-dimensional by multilayer formation may consequently provide device surfaces with a step (difference in height at surface). This step may cause break of wiring patterns, or marginal shortage of the depth of focus in lithographic processes. To prevent this, techniques for the planarization of multi-layered films are indispensable. To make planarization in regions of a millimeter order, chemical-mechanical polishing (abbreviated "CMP") is commonly used. This chemical-mechanical polishing is also utilized in shallow-trench isolation, metal plug and wire formation (damascene), and its studies are made on silicon oxide films, tungsten, polysilicon, copper and so forth.

However, when this chemical-mechanical polishing is used, any dishing occurring at the time of polishing and any step caused by erosion may additionally come into question. Incidentally, the dishing is a phenomenon that, when, e.g., buried wiring of a metal is formed in an insulating film, a hollow like a dish is produced as a result of the polishing of the metal in excess beyond the insulating film. The erosion is a phenomenon that, in an area where wirings stand close together, a step is produced as a result of the polishing of wiring and insulating film in excess to the part having no wiring. When the chemical-mechanical polishing is used, it is required to keep these phenomena from occurring.

Accordingly, when a buried pattern is formed in a substrate, it is common to provide a barrier layer between the substrate and the buried pattern and polish the buried material and the barrier material through two-stage polishing making use of different slurries so that the phenomena causative of such surface steps can be avoided. More specifically, dales are formed in a substrate, and on its surface a barrier film comprised of a barrier material and a buried film comprised of a buried-film material are formed in order, followed by the two-stage polishing making use of different slurries to obtain a buried pattern buried in the dales while keeping the dishing and erosion from occurring.

In this method, a slurry having a much higher polishing rate on the buried-film material than the polishing rate on the barrier material is used in the first-stage polishing to remove the buried film from the surface of the barrier film at its part other than the dales. Then, in the second-stage polishing, a slurry having a much higher polishing rate on the barrier material than the polishing rate on the substrate material is used to remove the barrier film from its part other than the dales. As methods for such polishing, the following techniques (a) to (c) are known, for example.

(a) Japanese Patent Application Laid-open No. 10-163142 discloses that, in the chemical-mechanical polishing of tungsten (W)/silicon oxide ($SiO_2$) film, the dishing can be made less occur by using a polishing composition having a polishing-rate ratio (selection ration) of $W/SiO_2 \geqq 6$ and also having a great polishing rate on tungsten.

(b) Japanese Patent Application Laid-open No. 10-214834 discloses a polishing method in which a silicon oxide film, a titanium (Ti) film, a titanium nitride (TiN) film and a tungsten film are formed on a substrate in this order and thereafter a pattern of tungsten contact holes is formed by chemical-mechanical polishing. In this method, first polishing is performed until the titanium film comes uncovered, using a slurry having a polishing-rate selection ratio of W>Ti (preferably W/Ti>2) and $W/SiO_2>3$, and thereafter second polishing is performed using a slurry having a polishing-rate selection ratio of $Ti>SiO_2$ and $0.5 \leqq W/SiO_2 \leqq 3$, to keep the erosion from occurring.

(c) Japanese Patent Application Laid-open No. 2001-44156 discloses a polishing method in which, when a silicon oxide film, a tantalum nitride (TaN) film and a copper (Cu) film are formed on a substrate in this order and a pattern of wiring or the like is formed by chemical-mechanical polishing, first polishing is performed by polishing Cu and TaN until the $SiO_2$ film comes uncovered, and thereafter second polishing is performed using a slurry having a polishing-rate selection ratio of $SiO_2/Cu=0.2$ to 5, to keep the erosion from occurring.

Where the above method (a) is used when buried wiring is formed in a silicon substrate, the selection ratio of polishing rate is so great that the polishing end-point detection at the time the $SiO_2$ film has come uncovered can be made with ease. Thus, according to this method, overpolishing may less occur, so that the dishing may less occur, as so reported. In fact, however, tungsten at the part of wiring is slightly polished away to cause the dishing correspondingly. This slight dishing may be not on a level problematic in present generation, but is considered to come problematic in future generation which may make progress for finer patterning. Also, while the $SiO_2$ is little polished in an area having no tungsten pattern, the tungsten at the part of wiring in an area where the tungsten pattern stands close together is polished and at the same time the $SiO_2$ is polished on, though slightly, to cause the erosion inevitably. There is such a problem, too.

In the method (b), the selection ratio in the second polishing is set to be $0.5 \leqq W/SiO_2 \leqq 3$. However, experiments made by the present inventors have come upon a case in which dishing and erosion have occurred in fact when the polishing is performed using a slurry having the polishing-rate ratio of $W/SiO_2$ of about 0.5 or 3.

As also disclosed in the above Japanese Patent Application Laid-open No. 10-214834, a slurry making use of silica particles as abrasive grains and ammonium hydroxide or potassium hydroxide as a pH adjuster is used in the second polishing. This slurry is a slurry commonly used for the polishing of insulating films, and it is noted that "tungsten is little polished" (page 8, line 30). In fact, however, tungsten is slightly etched by using such an alkali type slurry. Hence, where CMP is performed especially on fine wiring or plugs of tungsten, the slurry may enter through seams formed when tungsten film is formed, to cause etching in the wiring or plugs, so that key holes may be produced to cause an increase in wiring resistance. Such a problem may arise.

In addition, since the tungsten is little polished by using this slurry, reverse dishing (a state in which tungsten plugs or wiring comes protruded from the insulating films) may occur to produce an additional step. Moreover, where any tungsten film has remained in the first polishing, the part of tungsten having remained is not polished in the second polishing to provide a short. Also, this slurry may separately materialize "average polishing rates of titanium film and oxide film are both 100 nm/minute" (page 8, line 29) and "a polishing-rate selection ratio that the polishing rate on the upper-layer conductive film (W) is three times or less the polishing rate on the insulating films" (page 10, line 34). However, it is impossible to materialize both of these simultaneously because of the use of the slurry with which the tungsten is little polished. Furthermore, titanium and tungsten are polished without use of any oxidizing agent, and hence, in fine patterns, any titanium and tungsten remaining as polish leavings may again adhere to cause a short inevitably.

In this method, it is also necessary to clean wafers sufficiently after the first polishing, because the slurry used in the first polishing is acidic and the slurry used in the second polishing is alkaline. If the cleaning is insufficient, the slurry may contaminate in the second polishing to cause a change in action of chemical components contained therein and at the same time abrasive grains alumina used in the first slurry may agglomerate under alkaline conditions to cause polish mars.

According to the above method (c), the selection ratio $SiO_2/W$ in the second polishing is set to be 0.2 to 5. However, experiments made by the present inventors have come upon a case in which dishing and erosion have occurred when the damascene to form tungsten wiring is performed using a slurry having the polishing-rate ratio of $SiO_2/Cu$ of about 0.2 or 5. Also, in this method, a slurry containing alumina abrasive grains is used as a copper-polishing slurry and a slurry containing silica abrasive grains is used as a $SiO_2$-polishing slurry. However, in general, under acidic conditions, alumina stands charged positively and on the other hand the silica stands charged negatively. Hence, where these are mixed, alumina and silica attract each other to agglomerate to cause polish mars.

SUMMARY OF THE INVENTION

Accordingly, an object of the present invention is to provide a slurry, and a chemical-mechanical polishing method, which can materialize at a high polishing rate a buried structure free from any step or steps, and provide a wiring-substrate manufacturing process making use of the method.

To achieve the above object, the present invention provides a semiconductor device manufacturing process in which a barrier film and a buried film which are provided on the surface of a silicon substrate having dales covered with the barrier film on their inner walls and bottoms and filled with the buried film in their interiors are polished with an acidic third slurry containing an oxidizing agent and from 10 to 28% by weight of abrasive grains.

Patterns of a semiconductors or the like are commonly formed by forming a resist pattern on a silicon substrate on which an insulating films has been formed, etching the silicon substrate, removing the resist, forming a conductor film, and removing by CMP the conductor film at its part other than the prescribed pattern. However, with regard to a fine pattern of L/S=150/150 (nm), any patterning can not be performed by direct photolithography because of an insufficient resolution.

Accordingly, the present invention provides, as an example thereof, a semiconductor device manufacturing process comprising the steps of:

(1) a dale-forming step of forming a resist pattern on a silicon substrate by, e.g., photolithography and etching the silicon substrate to remove the resist by, e.g., stripping to form dales at the surface of the silicon substrate;

(2) an insulating-film-forming step of forming on the substrate in which the dales have been formed an insulating film by, e.g., CVD (chemical vapor deposition) in such a way that the inner walls and bottoms of the dales are covered with the insulating film;

(3) a barrier-film-forming step of forming a barrier film on the surface of the substrate in such a way that the inner walls and bottoms of the dales are covered with the barrier film;

(4) a buried-film-forming steps of forming a buried film in such a way that the interiors of the dales are filled therewith, covering the surface of the buried film; and (5) a polishing step of subjecting the barrier film and buried film on the silicon substrate surface to chemical-mechanical polishing with an acidic third slurry containing an oxidizing agent and from 10 to 28% by weight of abrasive grains.

The above third slurry is obtained by mixing a first slurry capable of polishing the silicon substrate or oxide film and a second slurry capable of polishing the barrier film and buried film to prepare a slurry. Accordingly, the semiconductor device manufacturing process of the present invention may further comprise a slurry preparation step of mixing a first slurry capable of polishing the silicon substrate or oxide film and a second slurry capable of polishing the barrier film and buried film to prepare a third slurry.

BRIEF DESCRIPTION OF THE DRAWINGS

These and other features, objects and advantages of the present invention will become more apparent from the following description when taken in conjunction with the accompanying drawings wherein:

FIG. 1 illustrates a conventional polishing method.

FIG. 2 illustrates an example of a polishing method according to the present invention.

DESCRIPTION OF THE PREFERRED EMBODIMENTS

Figure 3A:
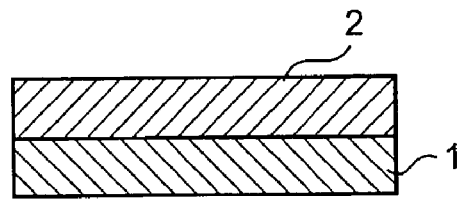
FIGS. 3A to 3G illustrate manufacturing steps in Examples.

In the present invention, a third slurry is used which is prepared by mixing a first slurry capable of polishing the silicon substrate or oxide film and a second slurry capable of polishing the barrier film and buried film.

Here, what is meant by "capable of polishing" is that the polishing rate under a polishing pressure of 14 kPa (about 2 PSI) and at a number of platen revolutions of 90 rpm or more is 50 nm/minute or more in respect of both tungsten film and silicon oxide film.

There are no particular limitations on the method of mixing the first and second slurries. For example, the two slurries may be mixed in a solution, or may be mixed in a pipe through which the third slurry is fed to the polishing surface, or may be mixed on a polishing pad. There are no particular limitations also on the slurries to be mixed, and any slurries for polishing tungsten films and slurries for polishing Sio$_2$ films may be used which are widely commonly available. Their mixing ratio may also appropriately be determined. They may preferably be mixed in a ratio which makes the polishing rates of the tungsten film and the substrate (SiO$_2$ film) substantially equal (preferably a polishing-rate (selection) ratio of W/SiO$_2$=0.55 to 1.8).

In the case when the third slurry is prepared by mixing the first slurry for polishing the silicon substrate or oxide film and the second slurry for polishing the barrier film and buried film, an oxidizing agent may further be added. There are also no particular limitations on this oxidizing agent as long as it has redox potential at which the buried film (preferably tungsten film) can be oxidized. Preferred is H$_2$O$_2$ containing no metal impurities. The first slurry used in the present invention may preferably have a pH on the acid side, and particularly preferably a pH of 4 or less, at which the tungsten does not dissolve.

The semiconductor device manufacturing process of the present invention is particularly suited for a case in which the silicon substrate has a silicon oxide insulating film on its surface, the barrier film is formed of titanium nitride and the buried film is formed of tungsten.

As a slurry preferred in the semiconductor device manufacturing process of the present invention, the present invention also provides a slurry having the ratio of the polishing rate on a buried-film material (in particular, tungsten) to the polishing rate on a substrate material (in particular, silicon oxide), of from 0.55:1 to 1.8:1. This slurry of the present invention may preferably have the ratio of the polishing rate on a buried-film material (in particular, tungsten) to the polishing rate on a substrate material (in particular, titanium oxide), of from 0.55:1 to 1.8:1.

The present invention still also provides a slurry for chemical-mechanical polishing which is used to polish a barrier film and a buried film which are provided on the surface of a silicon substrate having dales covered with the barrier film on their inner walls and bottoms and filled with the buried film in its interior; the slurry being an acidic slurry containing an oxidizing agent and from 10% by weight to 28% by weight of abrasive grains.

In the slurry of the present invention, the oxidizing agent may preferably be hydrogen peroxide and the abrasive grains may preferably be colloidal silica. The hydrogen peroxide may preferably be in a concentration of from 0.5% by weight to 5% by weight. Also, as stated above, the polishing rate on a substrate material (in particular, silicon oxide), that on a buried-film material (in particular, tungsten) and that on a barrier-film material (in particular, titanium oxide) may preferably be substantially equal to one another (i.e., the difference in polishing rate is within 30%). In particular, it is preferable for the present invention that the polishing rate on a substrate material (in particular, silicon oxide) and that on a buried-film material (in particular, tungsten) are substantially equal to each other.

The slurry of the present invention may also preferably contain the abrasive grains in an amount of from 10% by weight to 28% by weight, and more preferably from 15% by weight to 23% by weight. A slurry containing the abrasive grains in an amount of from 15% by weight to 19% by weight is particularly preferred because the dishing and the erosion can almost be prevented under usual polishing conditions. Also, as polishing conditions, a polishing pressure of from 14 kPa to 35 kPa (about 2 PSI to about 5 PSI) and a number of platen revolutions of from 93 rpm to 124 rpm are preferable for the present invention.

FIG. 1 illustrates a conventional case in which only a buried-wiring material (W) 5 is polished. As can be seen from FIG. 1, the cross-sectional shape of each dale 3 for buried wiring 6 is not rectangular, where there is a possibility that the wirings 6 adjacent to each other in the pattern have come into a short at the time an insulating film is formed on a patterned insulating film 2 by, e.g., CVD. However, in the semiconductor device manufacturing process of the present invention, as shown in FIG. 2, a conductor 5 and an insulating film 2 can be polished together, and hence margins for preventing such a short can be ensured.

In the conventional method, the dishing and erosion which may cause additional surface steps commonly greatly come into question when the metal damascene is performed. However, according to the present invention, these can be made to less occur.

With regard to the semiconductor device manufacturing process of the present invention, manufacturing steps of forming especially on a silicon substrate the buried wiring comprised of tungsten are described below in greater detail with reference to the accompanying drawings.

EXAMPLE 1

Figure 3B:
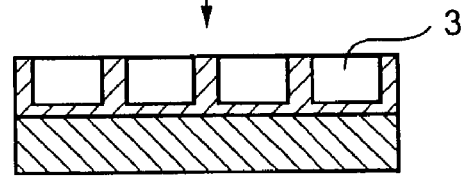
Figure 3C:
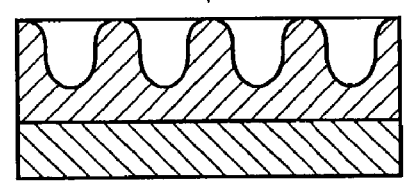
Figure 3D:
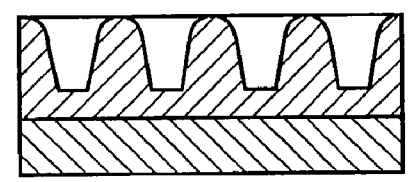

(1) Formation of Dales for Wiring:

First, using TEOS (tetraethoxysilane) as a material, silicon oxide film (SiO$_2$ film) 2 of about 1 μm in thickness was formed on the surface of a silicon substrate 1 (FIG. 3A) by CVD. Next, by photolithography, the silicon oxide film 2 was coated thereon with a photosensitive resin composition, which was then dried to form a resist pattern, followed by reactive ion etching to form groovelike wiring dales 3 of about 400 nm in width and about 300 nm in depth each, and then the resist was removed (FIG. 3B). Thereon a silicon oxide film of 150 nm in thickness was formed by CVD (FIG. 3C), followed by anisotropic etching to form groovelike dales for wiring of about 100 nm in width and about 260 nm in depth each (FIG. 3D).

Figure 3E:
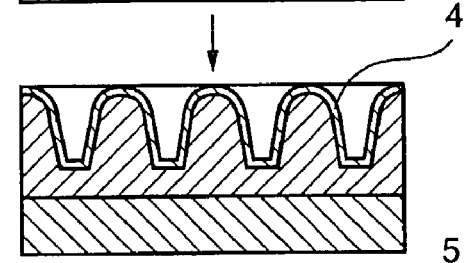
Figure 3F:
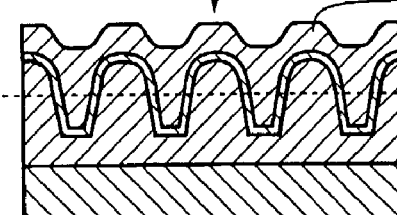
Figure 3G:
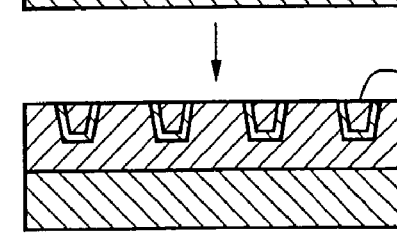

(2) Formation of Barrier Film and Buried Film:

Subsequently, on the surface of the silicon oxide film 2, inclusive of the inner walls and bottoms of the groovelike dales 3, a barrier film 4 of about 10 nm which was comprised of titanium nitride (TiN) was formed by CVD (FIG. 3E). On the whole surface of this barrier film 4, a tungsten (W) film (buried film) 5 was further deposited by CVD until the interiors of the wiring grooves 3 were filled and further the layer thickness extending from the main surface of the dale-formed plane of the silicon oxide film 2 came to 600 nm (FIG. 3F).

(3) Preparation of Slurry:

In this Example, the fist slurry, insulating-film-polishing slurry (Klebosol, acidic, available from Clariant Co; colloidal silica; average particle diameter: 50 nm) and the second slurry, tungsten-polishing slurry (SEMI-SPERSE W2000, available from Cabot Corp.) were mixed in a proportion of 50:50 in mixing ratio, and, in the mixed slurry formed, an aqueous 30% hydrogen peroxide solution was further mixed in a container to have a hydrogen peroxide concentration of 2% in the total weight of the slurry to obtain a mixture which was used as the third slurry.

Figure 4:
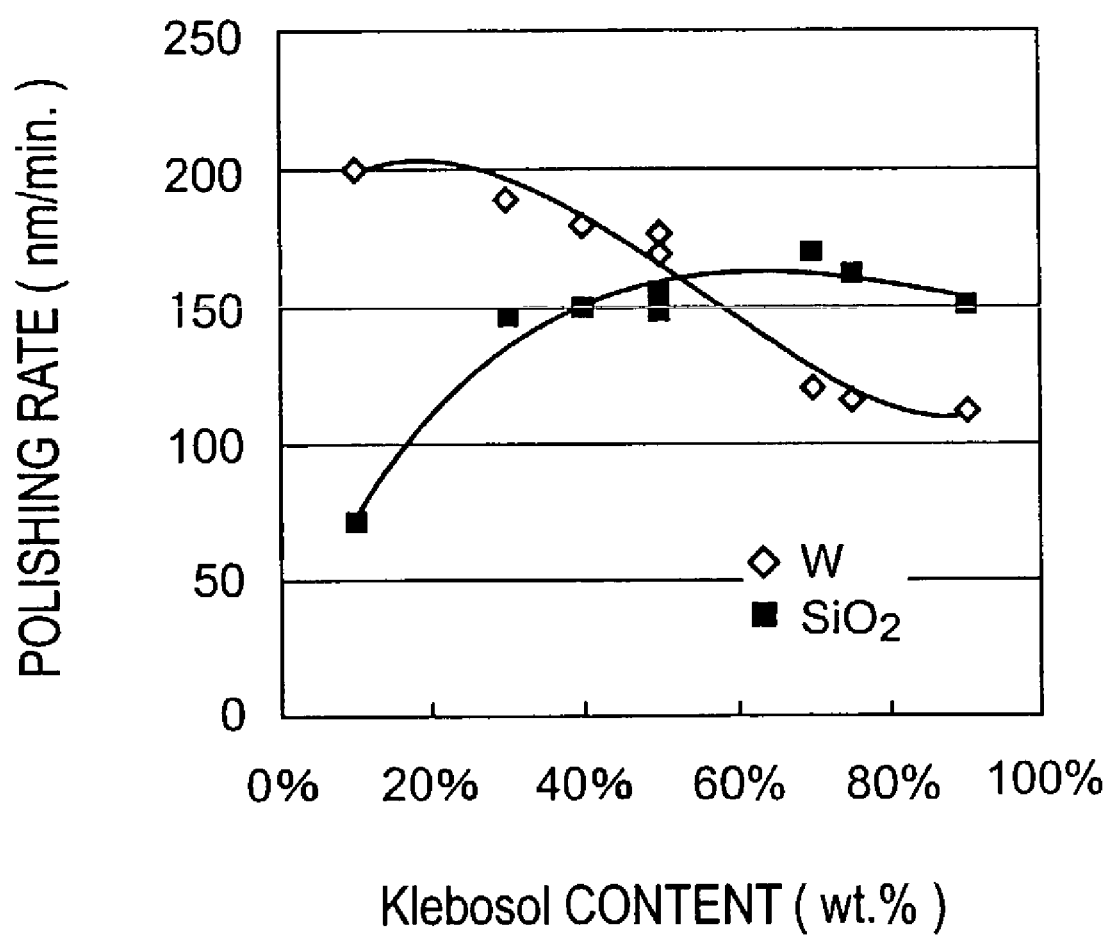
FIG. 4 is a graph showing the relationship between the polishing rate of a film to be polished and the mixing proportion of slurries.

In the mixed slurry of the first slurry (hereinafter "insulating-film-polishing slurry" or "SiO$_2$-film-polishing slurry") and the second slurry (hereinafter "tungsten-polishing slurry"), the polishing rates on tungsten and SiO$_2$ come as shown in FIG. 4, in accordance with the mixing ratio. In this Example, the mixing ratio was set to be 50:50 so as to make the W/SiO$_2$ polishing-rate (selection) ratio substantially 1. The selection ratio in the third slurry obtained was W film/SiO$_2$ film=1.1.

(4) Polishing:

The surface of the substrate with buried wiring (FIG. 3F) obtained in the above step (2) was subjected to chemical-mechanical polishing using the slurry obtained in the above step (3), by means of a polishing machine and under the following conditions.

Polishing Conditions
Polishing machine: Self-made machine.
Polishing pad: IC1400, available from Rodel Co.
Slurry feed rate: 200 ml/minute.
Polishing pressure: 27.5 kPa.
Number of platen revolutions: 93 rpm.
Polishing time: 4.5 minutes.

The level of dishing and maximum level of erosion of the polished surface thus obtained were measured. One in which the level of dishing and the level of erosion were both 50 nm or less was evaluated as "A", and one in which either of them was more than 50 nm as "B". The results are shown in Table 1. In Table 1, "selection ratio" is the value of (polishing rate on tungsten film)/(polishing rate on Sio$_2$ film).

Here, the dishing level was calculated from SEM images of wiring-part cross sections, and the erosion level from measurements found by measuring differences in height between an area having no wiring pattern and an area where wirings stood close together. In the substrate with buried wiring obtained in this Example, both the dishing and the erosion were greatly lessened to obtain good results.

Thus, the use of the third slurry made it possible to form the tungsten wiring buried in the silicon substrate, in the state its surface was very flat, so that, with less influence on the next stage of manufacture, it was able to manufacture a semiconductor device having good characteristics.

EXAMPLE 2

Dales were formed and a barrier film and a buried film were formed in the same manner as in Example 1. Thereafter, as the first polishing, tungsten and TiN were polished for 3.5 minutes, using as the third slurry a slurry prepared by mixing in a tungsten-polishing slurry (SEMI-SPERSE W2000, available from Cabot Corp.) an aqueous 30% hydrogen peroxide solution in a container to have a hydrogen peroxide concentration of 2% in the total weight of the mixed slurry, and the polishing was stopped at the time the SiO$_2$ film came uncovered. Subsequently, as the second polishing, polishing was performed on another platen in the same manner as the step (3) in Example 1 except that the polishing time was changed to 0.5 minute.

The results of the polishing are shown in Table 1. In this Example, too, it was able to lessen the dishing and the erosion greatly, showing effective results, and the present invention was ascertained to be effective also for keeping the tungsten film from remaining as polish leavings.

EXAMPLE 3

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 70/30) of a tungsten-polishing slurry (SEMI-SPERSE W2000, available from Cabot Corp.) and an SiO$_2$-film-polishing slurry (Klebosol, acidic, available from Clariant Co.) an aqueous 30% hydrogen peroxide solution in a container to have a hydrogen peroxide concentration of 2% in the total weight of the slurry was used as the third slurry. The polishing time was changed to 4 minutes. The selection ratio of polishing rates in the third slurry used in this Example was W film/SiO$_2$ film=1.4.

TABLE 1

| Example | Slurry mixing proportion W/SiO$_2$ | Abrasive conc. (wt. %) | Polishing rate (nm/min.) W | Polishing rate (nm/min.) SiO$_2$ | Selection radio | Dishing level (nm) | Maximum erosion level (nm) | Evaluation |
|---|---|---|---|---|---|---|---|---|
| 1 | 50/50 | 16 | 177 | 155 | 1.1 | 0 | 20 | ○ |
| 2 | 50/50 | 16 | 170 | 148 | 1.1 | 0 | 25 | ○ |
| 3 | 70/30 | 12 | 190 | 145 | 1.3 | 30 | 40 | ○ |
| 4 | 60/40 | 14 | 180 | 150 | 1.2 | 10 | 30 | ○ |
| 5 | 30/70 | 21 | 120 | 170 | 0.7 | 15(凸) | 30 | ○ |
| 6 | 25/75 | 22 | 115 | 162 | 0.7 | 30(凸) | 45 | ○ |
| 7 | 25/75 | 22 | 190 | 211 | 0.9 | 5(凸) | 20 | ○ |
| 8 | 10/90 | 26 | 110 | 150 | 0.7 | 17(凸) | 30 | ○ |
| 9 | 90/10 | 28 | 110 | 150 | 0.7 | 30(凸) | 40 | ○ |
| 10 | 30/70 | 16 | 175 | 170 | 1.0 | 0 | 11 | ○ |
| 11 | 30/70 | 16 | 220 | 220 | 1.0 | 0 | 10 | ○ |
| 12 | 50/50 | 13 | 125 | 122 | 1.0 | 0 | 12 | ○ |
| 13 | 25/75 | 17 | 240 | 235 | 1.0 | 0 | 10 | ○ |
| 14 | 15/85 | 19 | 200 | 250 | 0.8 | 7(凸) | 25 | ○ |
| 15 | 65/35 | 10 | 170 | 130 | 1.3 | 10 | 30 | ○ |
| 16 | 10/90 | 19 | 85 | 120 | 0.7 | 15(凸) | 30 | ○ |
| 17 | 40/60 | 14 | 120 | 122 | 1.0 | 0 | 5 | ○ |
| 18 | 50/50 | 13 | 130 | 130 | 1.0 | 0 | 6 | ○ |
| 19 | 35/65 | 15 | 100 | 100 | 1.0 | 0 | 5 | ○ |
| Comparative Example | 100/0 | 5 | 220 | 2 | 110 | 55 | 200 | X |

As can be seen from the results of polishing shown in Table 1, the dishing level and the erosion level were a little larger than those in Example 1, but good results were obtained also in this Example.

EXAMPLE 4

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 60/40) of a tungsten-polishing slurry (SEMI-SPERSE W2000, available from Cabot Corp.) and an $SiO_2$-film-polishing slurry (Klebosol, acidic, available from Clariant Co.) an aqueous 30% hydrogen peroxide solution in a container to have a hydrogen peroxide concentration of 2% in the total weight of the slurry was used as the third slurry. The polishing time was changed to 4 minutes. The selection ratio of polishing rates in the third slurry used in this Example was W film/$SiO_2$ film=1.3.

The results of the polishing are shown in Table 1. In this Example, too, it was able to lessen the dishing and the erosion greatly, and good results were obtained.

EXAMPLE 5

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 30/70) of a tungsten-polishing slurry (SEMI-SPERSE W2000, available from Cabot Corp.) and an $SiO_2$-film-polishing slurry (Klebosol, acidic, available from Clariant Co.) an aqueous 30% hydrogen peroxide solution in a container to have a hydrogen peroxide concentration of 2% in the total weight of the slurry was used as the third slurry. The polishing time was changed to 5.6 minutes. The selection ratio of polishing rates in the third slurry used in this Example was W film/$SiO_2$ film=0.7.

The results of the polishing are shown in Table 1. In this Example, too, it was able to lessen the dishing and the erosion greatly, and good results were obtained.

EXAMPLE 6

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 25/75) of a tungsten-polishing slurry (SEMI-SPERSE W2000, available from Cabot Corp.) and an insulating-film-polishing slurry ($SiO_2$ film) (Klebosol, acidic, available from Clariant Co.) an aqueous 30% hydrogen peroxide solution in a container to have a hydrogen peroxide concentration of 2% in the total weight of the slurry was used as the third slurry. The polishing time was changed to 6 minutes. The selection ratio of polishing rates in the third slurry used in this Example was W film/$SiO_2$ film=0.6.

As can be seen from the results of polishing shown in Table 1, the dishing level and the erosion level were a little larger than those in Example 1, but good results were obtained also in this Example.

EXAMPLE 7

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 25/75) of a tungsten-polishing slurry (SEMI-SPERSE W2000, available from Cabot Corp.) and an $SiO_2$-film-polishing slurry (Klebosol, acidic, available from Clariant Co.) an aqueous 30% hydrogen peroxide solution in a container to have a hydrogen peroxide concentration of 5% in the total weight of the slurry was used as the third slurry. The polishing time was changed to 3.5 minutes. The selection ratio of polishing rates in the third slurry used in this Example was W film/$SiO_2$ film=0.9.

The results of the polishing are shown in Table 1. In this Example, too, it was able to lessen the dishing and the erosion greatly, and good results were obtained.

EXAMPLE 8

Dales were formed and a barrier film and a buried film were formed in the same manner as in Example 1. Thereafter, the buried film and the barrier film were chemical-mechanical polished in the same manner as in Example 1 except that the polishing pressure, the polishing time and the slurry were changed.

In this Example, a slurry prepared by mixing in a mixed slurry (mixing ratio: 10/90) of a tungsten-polishing slurry (SEMI-SPERSE W2000, available from Cabot Corp.) and an $SiO_2$-film-polishing slurry (Klebosol, acidic, available from Clariant Co.) an aqueous 30% hydrogen peroxide solution in a container to have a hydrogen peroxide concentration of 5% in the total weight of the slurry was used as the third slurry. The polishing pressure was changed to 13.8 kPa, and the polishing time to 5.6 minutes. The selection ratio of polishing rates in the third slurry used in this Example was W film/$SiO_2$ film=0.7.

The results of the polishing are shown in Table 1. In this Example, too, it was able to lessen the dishing and the erosion greatly, and good results were obtained.

EXAMPLE 9

Dales were formed and a barrier film and a buried film, were formed in the same manner as in Example 1. Thereafter, the buried film and the barrier film were chemical-mechanical polished in the same manner as in Example 1 except that the polishing time and the slurry were changed.

In this Example, a slurry prepared by mixing in a mixed slurry (mixing ratio: 2/98) of a tungsten-polishing slurry (SEMI-SPERSE W2000, available from Cabot Corp.) and an insulating-film-polishing slurry ($SiO_2$ film) (Klebosol, acidic, available from Clariant Co.) an aqueous 35% hydrogen peroxide solution in a container to have a hydrogen peroxide concentration of 2% in the total weight of the slurry was used as the third slurry. The polishing time was changed to 3.5 minutes. The selection ratio of polishing rates in the third slurry used in this Example was W film/$SiO_2$ film=0.7.

As can be seen from the results of polishing shown in Table 1, the dishing level and the erosion level were a little larger than those in Example 1, but good results were obtained also in this Example.

EXAMPLE 10

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a mixed slurry (mixing ratio: 30/70) prepared using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The polishing time was changed to 4 minutes. The selection ratio of polishing rates in the third slurry used in this Example was W film/$SiO_2$ film=1.

Figure 5:
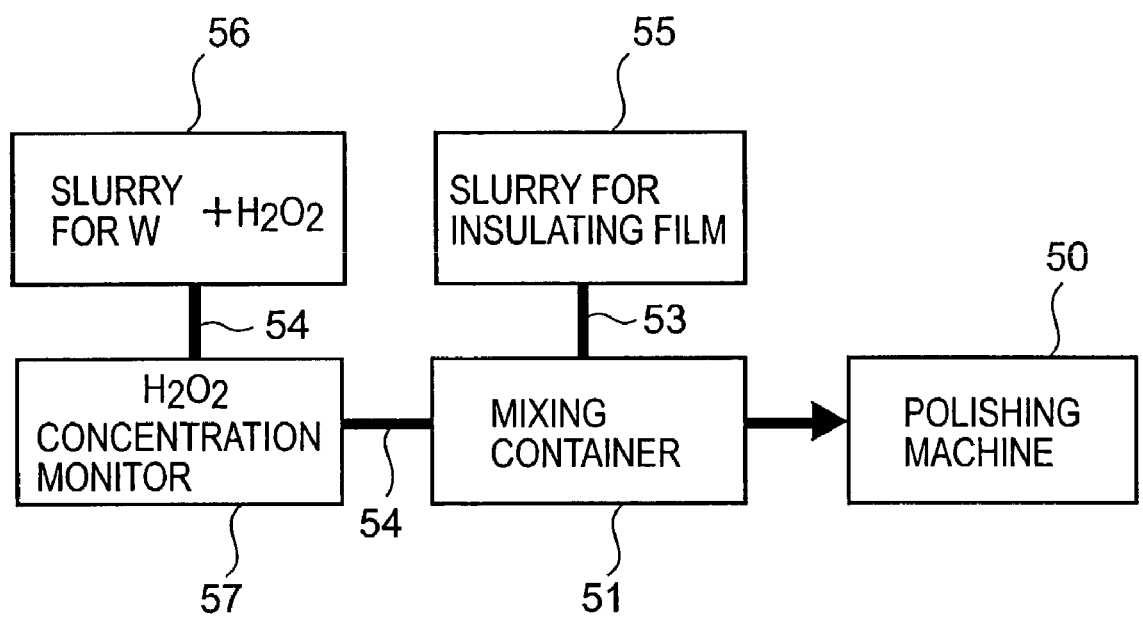
FIG. 5 illustrates a method of mixing slurries in Example 10.

A method of preparing the mixed slurry used in this Example is shown in FIG. 5. In this Example, the insulating-film-polishing slurry and the $H_2O_2$-containing tungsten-polishing slurry fed respectively from an insulating-film-polishing slurry tank 55 and an $H_2O_2$-containing tungsten-polishing slurry tank 56 through pipes 53 and 54 at flow rates so set as to provide the stated mixing ratio are mixed in a mixing container 51, and the mixed slurry formed is fed as the third slurry to a polishing machine 50. Also, an $H_2O_2$ concentration monitor 57 is attached to the pipe 54 connecting the mixing container 51 with the $H_2O_2$-containing tungsten-polishing slurry tank 56 so that the $H_2O_2$ concentration of the solution in the $H_2O_2$-containing tungsten-polishing slurry tank 56 can be feed-back controlled on the basis of the $H_2O_2$ concentration detected by this $H_2O_2$ concentration monitor 57, and can always be maintained at the stated concentration (2% in this Example).

The results of the polishing in this Example are shown in Table 1. In this Example, too, it was able to lessen the dishing and the erosion greatly, and good results were obtained.

EXAMPLE 11

Dales were formed and a barrier film and a buried film were formed in the same manner as in Example 1. Thereafter, the buried film and the barrier film were chemical-mechanical polished in the same manner as in Example 10 except that the polishing pressure was changed to 34.6 kPa and the polishing time to 3.2 minutes.

The results of the polishing are shown in Table 1. In this Example, too, it was able to lessen the dishing and the erosion greatly, and good results were obtained.

EXAMPLE 12

Dales were formed and a barrier film and a buried film were formed in the same manner as in Example 1. Thereafter, the buried film and the barrier film were chemical-mechanical polished in the same manner as in Example 1 except that the polishing pressure, the polishing time and the slurry were changed.

In this Example, a mixed slurry (mixing ratio: 50/50) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The polishing pressure was changed to 13.8 kPa and the polishing time to 5.5 minutes. The selection ratio of polishing rates in the third slurry used in this Example was W film/$SiO_2$ film=1.

The results of the polishing are shown in Table 1. In this Example, too, it was able to lessen the dishing and the erosion greatly, and good results were obtained.

EXAMPLE 13

Dales were formed and a barrier film and a buried film were formed in the same manner as in Example 1. Thereafter, the buried film and the barrier film were chemical-mechanical polished in the same manner as in Example 1 except that the number of platen revolutions, the polishing time and the slurry were changed.

In this Example, a mixed slurry (mixing ratio: 25/75) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The number of platen revolutions was changed to 124 rpm and the polishing time to 3 minutes. The selection ratio of polishing rates in the third slurry used in this Example was W film/$SiO_2$ film=1.

The results of the polishing are shown in Table 1. In this Example, too, it was able to lessen the dishing and the erosion greatly, and good results were obtained.

EXAMPLE 14

Dales were formed and a barrier film and a buried film were formed in the same manner as in Example 1. Thereafter, the buried film and the barrier film were chemical-mechanical polished in the same manner as in Example 13 except that the slurry was changed.

In this Example, a mixed slurry (mixing ratio: 15/85) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The selection ratio of polishing rates in this third slurry was W film/$SiO_2$ film=0.8.

The results of the polishing are shown in Table 1. In this Example, too, it was able to lessen the dishing and the erosion greatly, and good results were obtained.

EXAMPLE 15

Dales were formed and a barrier film and a buried film were formed in the same manner as in Example 1. Thereafter, the buried film and the barrier film were chemical-mechanical polished in the same manner as in Example 13 except that the slurry was changed.

In this Example, a mixed slurry (mixing ratio: 65/35) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The selection ratio of polishing rates in this third slurry was W film/$SiO_2$ film=1.3.

The results of the polishing are shown in Table 1. In this Example, too, it was able to lessen the dishing and the erosion greatly, and good results were obtained.

EXAMPLE 16

Dales were formed and a barrier film and a buried film were formed in the same manner as in Example 1. Thereafter, the buried film and the barrier film were chemical-mechanical polished in the same manner as in Example 13 except that the slurry was changed.

In this Example, a mixed slurry (mixing ratio: 10/90) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (PL4101, neutral, available from Fujimi Incorporated) was used as the third slurry. The selection ratio of polishing rates in this third slurry was W film/$SiO_2$ film=0.7.

The results of the polishing are shown in Table 1. In this Example, too, it was able to lessen the dishing and the erosion greatly, and good results were obtained.

EXAMPLE 17

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a mixed slurry (mixing ratio: 40/60) prepared in the same manner as in Example 10 (FIG. 5) using i) a slurry prepared by adding $H_2O_2$ to a tungsten-polishing slurry (SEMI-SPERSE W2000, available from Cabot Corp.) to have a hydrogen peroxide concentration of 2% and ii) an $SiO_2$-film-polishing slurry (neutral colloidal silica dispersion; average particle diameter: 20 nm) was used as the third slurry. The polishing time was changed to 5.5 minutes. The selection ratio of polishing rates in the third slurry used in this Example was W film/$SiO_2$ film=1.

The results of the polishing are shown in Table 1. In this Example, too, it was able to lessen the dishing and the erosion greatly, and good results were obtained.

Figure 6:
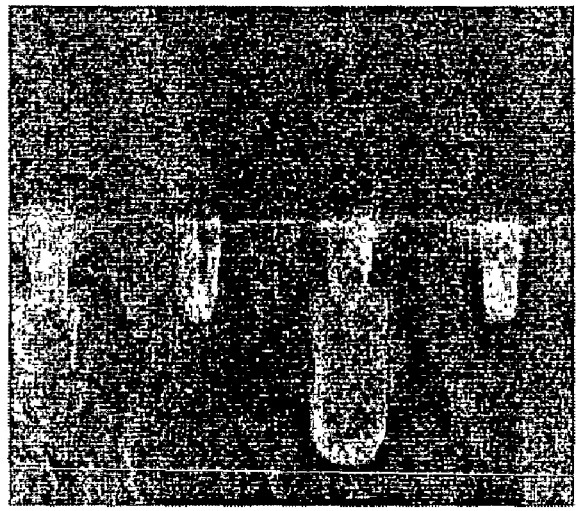
FIG. 6 illustrates an SEM picture image showing a cross-sectional shape of buried wiring formed in Example 17.

An SEM (scanning electron microscope) image showing a cross section of the wiring pattern formed in this Example is shown in FIG. 6. In this SEM image, it was observable that four lines of about 100 nm in width stood buried in the insulating film and any step little formed between the insulating film and the wiring. Slight hollows were seen in the insulating film in the vicinity of the wiring, but were very small (10 nm or less), showing good flatness.

EXAMPLE 18

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a mixed slurry (mixing ratio: 50/50) of i) a slurry prepared by adding $H_2O_2$ to a tungsten-polishing slurry (SEMI-SPERSE W2000, available from Cabot Corp.) to have a hydrogen peroxide concentration of 1.5% and ii) an $SiO_2$-film-polishing slurry (neutral colloidal silica dispersion; average particle diameter: 20 nm) was used as the third slurry. The polishing time was changed to 5.5 minutes. The selection ratio of polishing rates in the third slurry used in this Example was W film/$SiO_2$ film=1.

The results of the polishing are shown in Table 1. In this Example, too, it was able to lessen the dishing and the erosion greatly, and good results were obtained.

EXAMPLE 19

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Example, a mixed slurry (mixing ratio: 65/35) of i) a slurry prepared by adding $H_2O_2$ to a tungsten-polishing slurry (SEMI-SPERSE W2000, available from Cabot Corp.) to have a hydrogen peroxide concentration of 1% and ii) an $SiO_2$-film-polishing slurry (alkaline colloidal silica dispersion; average particle diameter: 20 nm), the pH of which was adjusted to 2 by further adding sulfuric acid, was used as the third slurry. The polishing time was changed to 7 minutes. The selection ratio of polishing rates in the third slurry used in this Example was W film/$SiO_2$ film=1.

The results of the polishing are shown in Table 1. In this Example, too, it was able to lessen the dishing and the erosion greatly, and good results were obtained.

Comparative Example

Dales were formed and a barrier film and a buried film were formed in the same manner as in Example 1. Thereafter, the buried film and the barrier film were chemical-mechanical polished in the same manner as in Example 1 except that the polishing time and the slurry were changed.

In this Comparative Example, a slurry prepared by mixing in a tungsten-polishing slurry (SEMI-SPERSE W2000, available from Cabot Corp.) an aqueous 30% hydrogen peroxide solution in a container to have a hydrogen peroxide concentration of 2% in the total weight of the mixed slurry was as the third slurry. The polishing time was changed to 5 minutes. The selection ratio of polishing rates in the third slurry used in this Comparative Example was W film/$SiO_2$ film=100/1.

Figure 7:
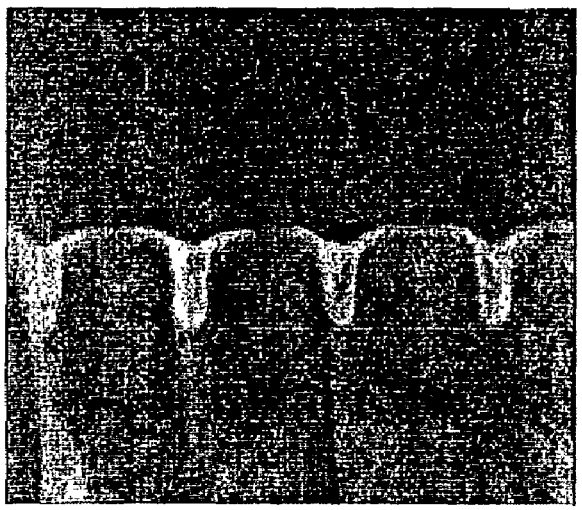
FIG. 7 illustrates an SEM picture image showing a cross-sectional shape of buried wiring formed in Comparative Example.

As shown in Table 1, the dishing level and the maximum erosion level were very great in this Comparative Example. An SEM image showing a cross section of the wiring pattern after the polishing in this Comparative Example is shown in FIG. 7. In this SEM image, it was observable that, between four lines of about 100 nm in width buried in the insulating film and the insulating film, large steps stood formed.

EXAMPLE 20

Figure 8:
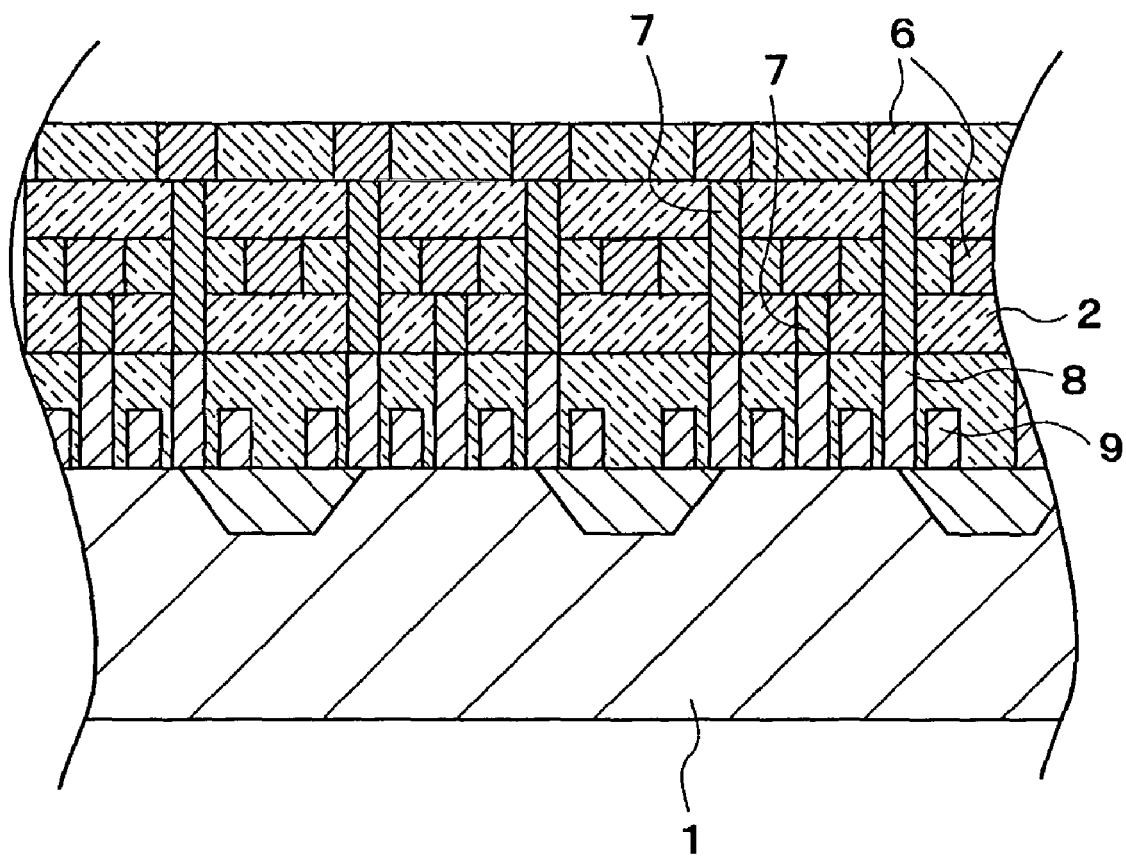
FIG. 8 is a schematic cross-sectional view for illustrating a semiconductor device according to the present invention.

FIG. 8 is a schematic cross-sectional view for illustrating a semiconductor device. In a semiconductor device manufacturing process in which transistor devices are fabricated on a substrate, polysilicon wiring and contact plugs are formed thereon, and tungsten or copper contact plugs and wiring are repeatedly formed, Examples 1 to 19 were applied when the tungsten buried wiring was formed. Also, it was ascertained that the same effects as those in Examples 1 to 19 were obtainable also when applied in the formation of tungsten contact plugs in which holes or rectangular grooves were formed in an insulating film in the same manner as in Example 1.

According to the present invention, in the process making use of the chemical-mechanical polishing to bury a different-type material in the substrate, the dishing and the erosion can be made less occur and a buried structure free from any step or steps can be materialized. Also, according to the present invention, the polishing can be performed at a high rate, the process of the present invention is suited for mass production, making it possible to manufacture wired substrates and semiconductor devices in a high yield and at a low cost.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A semiconductor device manufacturing process comprising the steps of:
    forming dales at a surface of a substrate;
    forming a barrier film on the surface of the substrate in such a way that the inner walls and bottoms of the dales are covered with the barrier film;
    forming a buried film in such a way that the interiors of the dales are filled therewith;
    preparing a third slurry by mixing a first slurry having a smaller polishing rate on the buried film than on the surface of the substrate and a second slurry having a greater polishing rate on the buried film than that on the surface of the substrate; and
    polishing at least one of the barrier film and the buried film on the substrate, wherein:
    said third slurry has a sufficiently low pH so as to be a strong acid slurry, sufficiently strong so as to prevent dissolution both of the barrier film and the buried film,
    the polishing step comprises subjecting at least one of the barrier film and the buried film on the surface of the substrate to chemical-mechanical polishing with the third slurry,
    the polishing rate of said third slurry on the buried film is greater than the polishing rate of said first slurry, and the polishing rate of said third slurry on the surface of the substrate is greater than the polishing rate of said second slurry; and
    said third slurry has the ratio of the polishing rate on the buried film to the polishing rate on the surface of the substrate within the range of from 0.7:1 to 1.3:1.

2. The semiconductor device manufacturing process according to claim 1, wherein said first slurry is a slurry containing from 5% by weight to 30% by weight of abrasive grains and capable of polishing the substrate, and said second slurry is a slurry containing from 0.1% by weight to 10% by weight of an oxidizing agent and capable of polishing the barrier film and the buried film.

3. The semiconductor device manufacturing process according to claim 2, wherein said oxidizing agent comprises at least one of hydrogen peroxide and periodic acid, and said abrasive grains comprise at least one of silica, alumina and ceria.

4. The semiconductor device manufacturing process according to claim 1, wherein:
    said substrate includes an insulating film as a surface film thereof; and
    the barrier film comprises a metal compound, and the buried film comprises a metal.

5. The semiconductor device manufacturing process according to claim 1, wherein said third slurry has a pH of 2.

6. The semiconductor device manufacturing process according to claim 1, wherein in said polishing step said third slurry polishes said at least one of the barrier film and the buried film and also subjects the substrate to chemical-mechanical polishing.

7. The semiconductor device manufacturing process according to claim 1, wherein said first slurry is capable of polishing a surface of said substrate and said second slurry is capable of polishing said at least one of the barrier film and the buried film.

8. The semiconductor device manufacturing proves according to claim 1, wherein said third slurry further comprises an oxidizing agent in addition to said first slurry and said second slurry.

9. The semiconductor device manufacturing process according to claim 1, wherein said third slurry contains 15–19% by weight abrasive grains.

10. The semiconductor device manufacturing process according to claim 1, wherein the substrate is chemically-mechanically polished by the third slurry in the polishing step.

11. The semiconductor device manufacturing process according to claim 1, wherein the polishing rate of the third slurry on the surface of the substrate and the polishing rate of the third slurry on the buried film are substantially equal.

12. The semiconductor device manufacturing process according to claim 1, wherein in said polishing step using the third slurry, the third slurry acts to polish each of the barrier film, the buried film and the substrate.

13. The semiconductor device manufacturing process according to claim 1, wherein said mixing the first slurry and the second slurry is carried out on a polishing pad.

14. A semiconductor device manufacturing process comprising the steps of:
    forming dales at a surface of a substrate;
    forming a barrier film on the surface of the substrate in such a way that the inner walls and bottoms of the dales are covered with the barrier film;
    forming a buried film in such a way that the interiors of the dales are filled therewith;
    preparing a third slurry by mixing a first slurry having a smaller polishing rate on the buried film than on the surface of the substrate and a second slurry having a greater polishing rate on the buried film than that on the surface of the substrate; and
    polishing at least one of the barrier film and the buried film on the substrate, wherein:
    said third slurry has a sufficiently low pH so as to be a strong acid slurry, sufficiently strong so as to prevent dissolution both of the barrier film and the buried film,
    the polishing step comprises subjecting at least one of the barrier film and the buried film on the substrate to chemical-mechanical polishing with the third slurry,
    said third slurry has the ratio of the polishing rate on the buried film to the polishing rate on the surface of the substrate within the range of from 0.7:1 to 1.3:1, and
    in said polishing step the substrate is also subjected to chemical-mechanical polishing with said third slurry.

15. The semiconductor device manufacturing process according to claim 14, wherein said substrate includes an insulating film on a semiconductor substrate, said dales are formed into said insulating film, and in said polishing step said insulating film of the substrate is subjected to chemical-mechanical polishing with said third slurry.

16. The semiconductor device manufacturing process according to claim 15, wherein said insulating film is a silicon oxide film, said silicon oxide film being on a silicon substrate.

17. The semiconductor device manufacturing process according to claim 14, wherein in said polishing step using the third slurry, the third slurry acts to polish each of the barrier film, the buried film and the substrate.

18. The semiconductor device manufacturing process according to claim 17, wherein in said polishing step each of the barrier film, the buried film and the substrate is polished by the third slurry so as to provide a substantially planar surface.

19. A semiconductor device manufacturing process comprising the steps of:
    forming dales at a surface of a substrate;
    forming a barrier film on the surface of the substrate in such a way that the inner walls and bottoms of the dales are covered with the barrier film;
    forming a buried film in such a way that the interiors of the dales are filled therewith;
    preparing a third slurry by mixing a first slurry having a smaller polishing rate on the buried film than on the surface of the substrate and a second slurry having a greater polishing rate on the buried film than that on the surface of the substrate; and
    polishing at least one of the barrier film and the buried film on the substrate, wherein:
    said third slurry has a sufficiently low pH so as to be a strong acid slurry, sufficiently strong so as to prevent dissolution both of the barrier film and the buried film, the polishing step comprises subjecting at least one of the barrier film and the buried film on the substrate to chemical-mechanical polishing with the third slurry,
    said third slurry has the ratio of the polishing rate on the buried film to the polishing rate on the surface of the substrate within the range of from 0.7:1 to 1.3:1, and
    said first slurry is capable of polishing said surface of the substrate and said second slurry is capable of polishing said at least one of the barrier film and the buried film, such that in the polishing step the substrate is also polished with the third slurry.

20. The semiconductor device manufacturing process according to claim 19, wherein said substrate includes an insulating film on a semiconductor substrate, said dales are formed into said insulating film, and in said polishing step said insulating film of the substrate is subjected to chemical-mechanical polishing with said third slurry.

21. The semiconductor device manufacturing process according to claim 20, wherein said insulating film is a silicon oxide film, said silicon oxide film being on a silicon substrate.

22. The semiconductor device manufacturing process according to claim 19, wherein in said polishing step using the third slurry, the third slurry acts to polish each of the barrier film, the buried film and the substrate.

23. The semiconductor device manufacturing process according to claim 22, wherein in said polishing step each of the barrier film, the buried film and the substrate is polished by the third slurry so as to provide a substantially planar surface.

* * * * *